(12) United States Patent
Bonifield et al.

(10) Patent No.: US 8,890,223 B1
(45) Date of Patent: Nov. 18, 2014

(54) HIGH VOLTAGE HYBRID POLYMERIC-CERAMIC DIELECTRIC CAPACITOR

(71) Applicant: Texas Instruments Incorporated, Dallas, TX (US)

(72) Inventors: Thomas Dyer Bonifield, Dallas, TX (US); Byron Williams, Plano, TX (US); Shrinivasan Jaganathan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/960,344

(22) Filed: Aug. 6, 2013

(51) Int. Cl.
| | | |
|---|---|---|
| *H01L 27/108* | (2006.01) | |
| *H01L 29/76* | (2006.01) | |
| *H01L 29/94* | (2006.01) | |
| *H01L 31/119* | (2006.01) | |
| *H01L 29/00* | (2006.01) | |
| *H01L 49/02* | (2006.01) | |
| *H01L 27/02* | (2006.01) | |

(52) U.S. Cl.
CPC ............ *H01L 27/0288* (2013.01); *H01L 28/40* (2013.01)
USPC ........... 257/296; 257/297; 257/298; 257/299; 257/300; 257/310; 257/311; 257/312; 257/313; 257/532; 257/E27.034; 257/E27.071

(58) Field of Classification Search
USPC ......... 257/296, 297, 298, 299, 300, 310, 311, 257/312, 313, 532, E27.034, E27.071
See application file for complete search history.

(56) References Cited

U.S. PATENT DOCUMENTS

| | | | | |
|---|---|---|---|---|
| 5,814,850 | A | * | 9/1998 | Iwasa .............................. 257/296 |
| 6,534,810 | B2 | * | 3/2003 | Baek .............................. 257/296 |
| 6,940,114 | B2 | * | 9/2005 | Oh et al. ........................ 257/296 |
| 7,064,366 | B2 | * | 6/2006 | Kang et al. ..................... 257/295 |
| 7,547,933 | B2 | * | 6/2009 | Takamatsu et al. ............ 257/295 |
| 7,732,895 | B2 | * | 6/2010 | Toda .............................. 257/533 |
| 7,750,485 | B2 | * | 7/2010 | Takahashi et al. ............. 257/782 |
| 8,440,508 | B2 | * | 5/2013 | Udayakumar et al. ......... 438/129 |
| 8,669,643 | B2 | * | 3/2014 | Takano et al. .................. 257/621 |
| 8,759,947 | B2 | * | 6/2014 | Tan et al. ....................... 257/532 |
| 2011/0049675 | A1 | * | 3/2011 | Nagai et al. .................... 257/532 |
| 2012/0112314 | A1 | * | 5/2012 | Jou et al. ........................ 257/532 |
| 2014/0183693 | A1 | * | 7/2014 | Tsai et al. ...................... 257/532 |

* cited by examiner

*Primary Examiner* — Ida M Soward

(74) *Attorney, Agent, or Firm* — Jacqueline J. Garner; Frederick J. Telecky, Jr.

(57) ABSTRACT

An integrated circuit includes isolation capacitors which include a silicon dioxide dielectric layer and a polymer dielectric layer over the layer of silicon dioxide. The silicon dioxide dielectric layer and the polymer dielectric layer extend across the integrated circuit. Top plates of the isolation capacitors have bond pads for wire bonds or bump bonds. Bottom plates of the isolation capacitors are connected to components of the integrated circuit. Other bond pads are connected to components in the integrated circuit through vias through the silicon dioxide dielectric layer and the polymer dielectric layer.

12 Claims, 12 Drawing Sheets

HIGH VOLTAGE HYBRID POLYMERIC-CERAMIC DIELECTRIC CAPACITOR

FIELD OF THE INVENTION

This invention relates to the field of integrated circuits. More particularly, this invention relates to high voltage capacitors in integrated circuits.

BACKGROUND OF THE INVENTION

An integrated circuit may receive input signals which have direct current (DC) bias levels that are, for example, several hundred volts above the operating voltage for the integrated circuit, necessitating isolation components between the input signals and components such as transistors in the integrated circuit. It may be desirable for the isolation component to provide transient protection and surge protection of several thousand volts, as well as long term reliability. It may further be desirable to integrate the isolation component into the integrated circuit, but meeting the protection and reliability goals while attaining a desired fabrication cost of the integrated circuit may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes isolation capacitors which include a silicon dioxide dielectric layer and a polymer dielectric layer over the layer of silicon dioxide. Top plates of the isolation capacitors have bond pads for wire bonds or bump bonds. Bottom plates of the isolation capacitors are connected to components of the integrated circuit.

DETAILED DESCRIPTION OF EXAMPLE EMBODIMENTS

The following co-pending patent application contains related material and is hereby incorporated by reference: U.S. patent application Ser. No. 13/960,406, filed Aug. 6, 2013.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
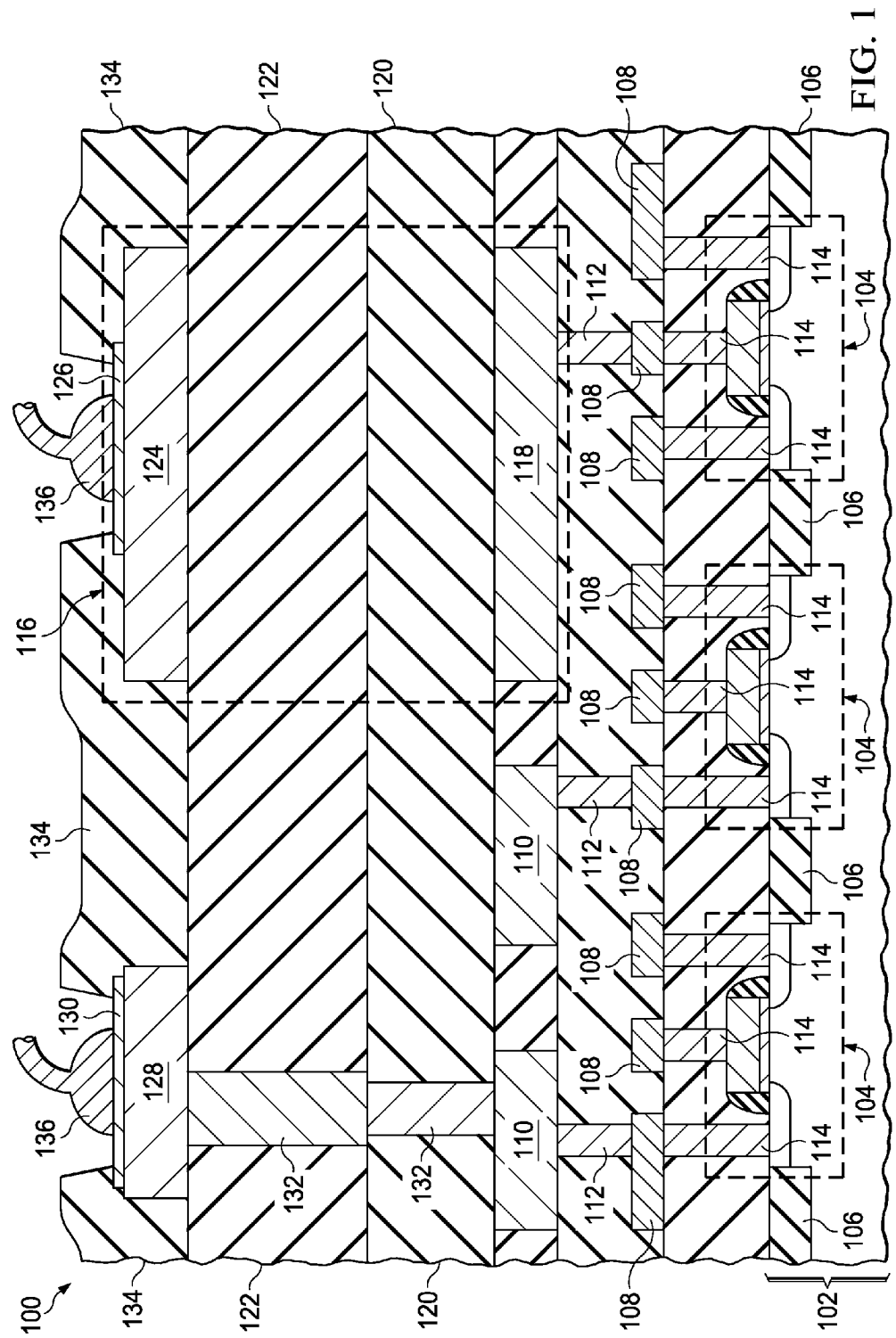
FIG. 1 is a cross section of an exemplary integrated circuit containing an isolation capacitor.

FIG. 1 is a cross section of an exemplary integrated circuit containing an isolation capacitor. The integrated circuit 100 is formed in and on a semiconductor substrate 102 and includes active components 104 which are depicted in FIG. 1 as transistors 104. The active components 104 may be laterally isolated by field oxide 106. The integrated circuit 100 further includes at least one level of metal interconnects; in the instant example, the integrated circuit 100 includes interconnects in a first metal level 108, and interconnects in a second metal level 110 which are vertically connected by vias 112 and connected to the active components 104 through contacts 114. The metal interconnects in the first metal level 108 and the second metal level 110 may include, for example, etched aluminum or damascene copper.

The integrated circuit 100 includes at least one isolation capacitor 116. A bottom plate 118 of the isolation capacitor 116 may, for example, be a part of the second metal level 110 as depicted in FIG. 1. The isolation capacitor 116 includes a silicon dioxide dielectric layer 120 which extends across the integrated circuit 100. A thickness of the silicon dioxide dielectric layer 120 is selected to provide long term reliability for the isolation capacitor 116. For example, an instance of the isolation capacitor 116 providing isolation up to 7000 volts DC may have the silicon dioxide dielectric layer 120 with a thickness of 9 microns.

The isolation capacitor 116 includes a polymer dielectric layer 122 over the silicon dioxide dielectric layer 120. The polymer dielectric layer 122 also extends across the integrated circuit 100. The polymer dielectric layer 122 may be, for example, polyimide which has been treated to remove residual moisture, poly(p-phenylene-2,6-benzobisoxazole) (PBO), benzocyclobutene (BCB), or a parylene polymer such as parylene C or parylene D. A thickness of the polymer dielectric layer 122 is selected to provide surge and transient protection for the isolation capacitor 116. For example, an instance of the isolation capacitor 116 providing protection from a voltage surge up to 10,000 volts and up to 5000 alternating current (AC) root-mean-square (rms) volts may have a thickness of 10 microns.

The isolation capacitor 116 includes a top plate 124 over the polymer dielectric layer 122. The top plate 124 is at least 5 microns thick. The top plate 124 may include, for example, etched aluminum or electroplated copper. A bond pad 126 is disposed on the top plate 124.

The integrated circuit 100 may include top level interconnect elements 128 over the polymer dielectric layer 122 which support bond pads 130 for low voltage signals or supply voltages. The top level interconnect elements 128 may be coupled to the active components 104 through vias 132 through the polymer dielectric layer 122 and the silicon dioxide dielectric layer 120.

A layer of protective overcoat 134 is disposed over the top plate 124 and the polymer dielectric layer 122, with openings for the bond pad 126 on the top plate 124 and the bond pads 130 for the low voltage signals and supply voltages. The bond pad 126 and the bond pads 130 may be wire bond pads which support wire bonds 136 as depicted in FIG. 1 or alternatively may be bump bond bonds which support bump bonds.

During operation of the integrated circuit 100, input signals applied to the bond pad 126 are transmitted to at least one instance of the active components 104 through the isolation capacitor 116. A capacitance of the isolation capacitor 116 may be, for example, 50 to 250 femtofarads. Forming the isolation capacitor 116 to include the polymer dielectric layer 122 over the silicon dioxide dielectric layer 120 may advantageously provide long term reliability and protection from voltage surges and transients.

Figure 2:
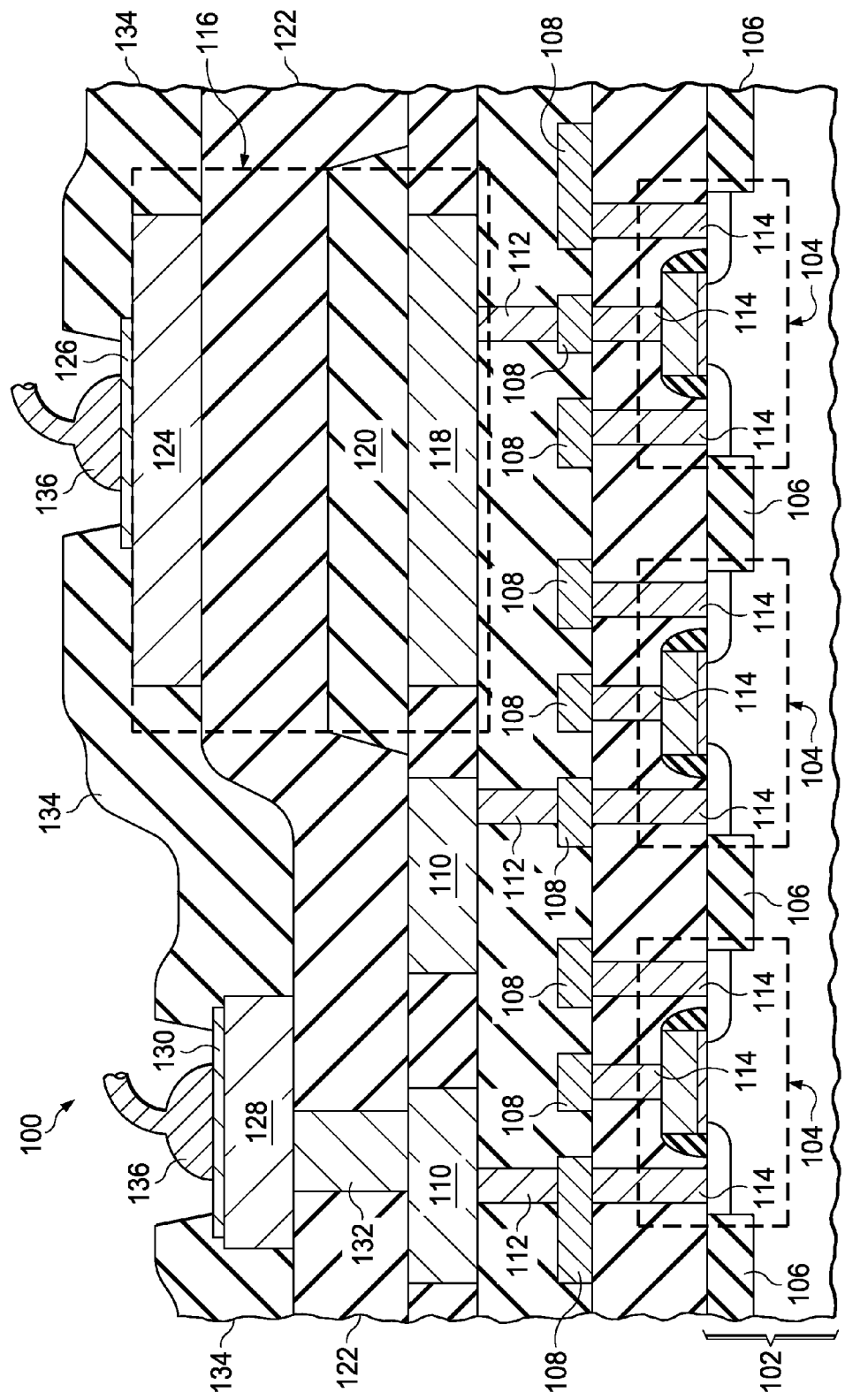
FIG. 2 is a cross section of the integrated circuit of FIG. 1, with a n alternate configuration of the silicon dioxide dielectric layer.

FIG. 2 is a cross section of the integrated circuit of FIG. 1, with an alternate configuration of the silicon dioxide dielectric layer 120. The silicon dioxide dielectric layer 120 is patterned to be localized to the isolation capacitor 116, so that top level interconnect elements 128 may be coupled to the active components 104 through vias 132 only through the polymer dielectric layer 122. Forming the silicon dioxide dielectric layer 120 so as to be localized to the isolation capacitor 116 eliminates vias through the silicon dioxide dielectric layer 120 and thus may advantageously reduce fabrication cost and complexity of the integrated circuit 100.

Figure 3A:
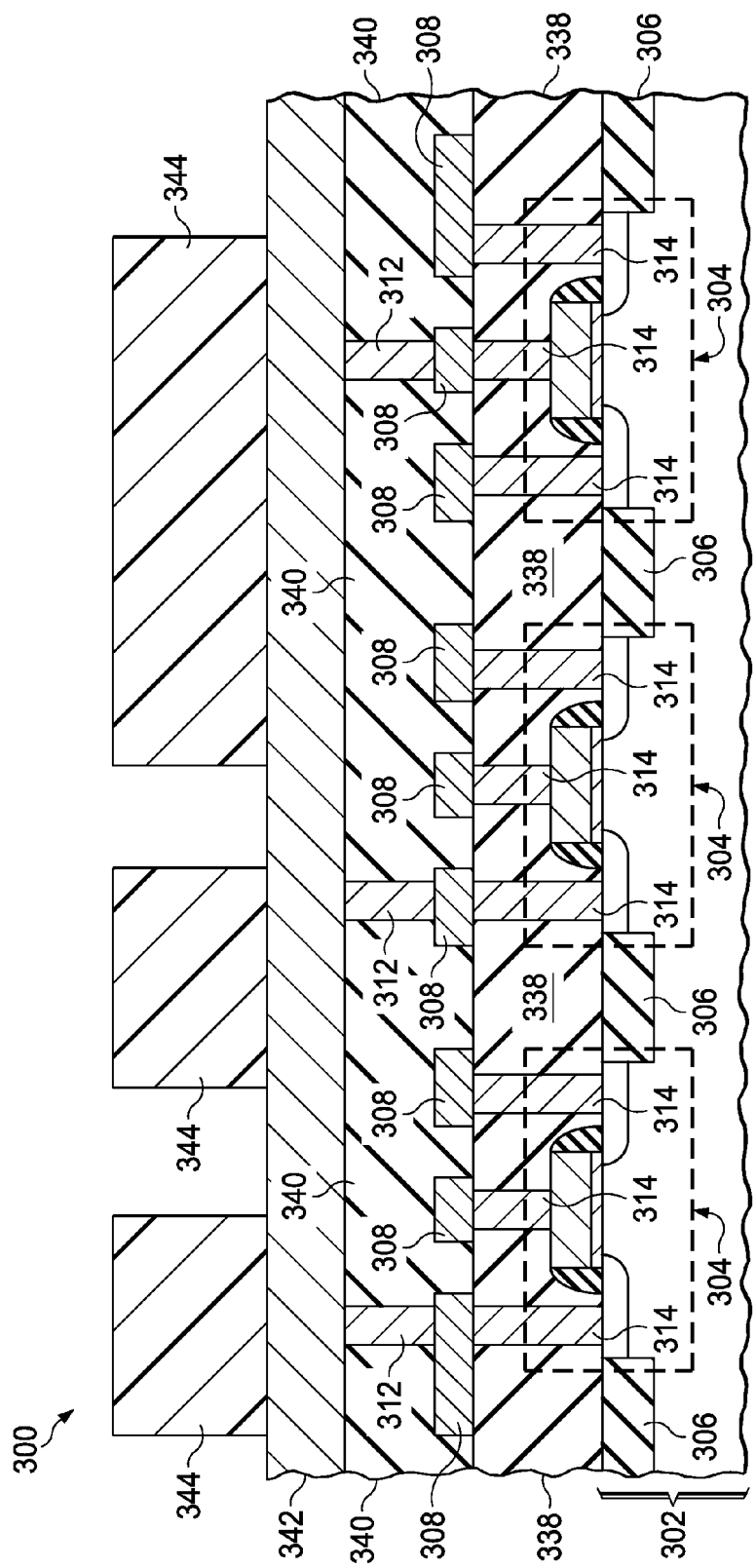
FIG. 3A through FIG. 3J are cross sections of another exemplary integrated circuit containing an isolation capacitor, depicted in successive stages of fabrication.

FIG. 3A through FIG. 3J are cross sections of another exemplary integrated circuit containing an isolation capacitor, depicted in successive stages of fabrication. Referring to FIG. 3A, the integrated circuit 300 is formed in and on a substrate 302 which includes semiconductor material. The substrate 302 may be, for example, a single crystal silicon wafer, a silicon-on-insulator (SOI) wafer, a hybrid orientation technology (HOT) wafer with regions of different crystal orientations, or other material appropriate for fabrication of the integrated circuit 300.

Elements of field oxide 306 may be formed at a top surface of the substrate 302 so as to laterally isolated components of the integrated circuit 300. The field oxide 306 may be formed, for example, using a local oxidation of silicon (LOCOS) process or a shallow trench isolation (STI) process. Active components 304, for example metal oxide semiconductor (MOS) transistors 304 as depicted in FIG. 3A, are formed in and on the substrate 302.

A pre-metal dielectric (PMD) layer 338 is formed over the active components 304 and the substrate 302. The PMD layer 338 may be, for example, a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide.

Contacts 314 are formed through the PMD layer 338 to make electrical connections to the active components 304. The contacts 314 may be formed, for example, by etching contact holes through the PMD layer 338 to expose the substrate 302 using a reactive ion etch (RIE) process, forming a liner of titanium and titanium nitride using a sputter process and an atomic layer deposition (ALD) process respectively, forming a tungsten layer on the liner using a CVD process so as to fill the contact holes, and removing the tungsten and liner from a top surface of the PMD layer 338 using etchback and/or chemical mechanical polish (CMP) processes.

Metal interconnects in a first metal level 308 are formed over the PMD layer 338, making electrical connections to the contacts 314. The metal interconnects in the first metal level 308 may be formed using an aluminum metallization process, by forming a layer of adhesion metal, for example titanium tungsten or titanium nitride, on the contacts and the PMD layer, forming a layer of sputtered aluminum, for example aluminum with a few percent titanium, copper and/or silicon, on the layer of adhesion metal, and possibly forming an optional layer of antireflection metal, such as titanium nitride, on the layer of sputtered aluminum. An etch mask is formed over the layer of antireflection metal so as to cover areas for the metal interconnects; the etch mask may include photoresist formed by a photolithographic process, or may include inorganic hard mask materials. An RIE process removes the layer of antireflection metal, the layer of sputtered aluminum and the layer of adhesion metal exposed by the etch mask, leaving the metal interconnects as depicted in FIG. 3A.

Alternatively, the metal interconnects in the first metal level 308 may be formed using a copper damascene process by forming a first intra-metal dielectric (IMD) layer over the PMD layer 338, and etching trenches in the IMD layer, commonly between 50 and 150 nanometers deep. A layer of liner metal such as tantalum nitride is formed on a bottom and sides of the trenches, commonly by physical vapor deposition, atomic layer deposition or chemical vapor deposition. A seed layer of copper is formed on the liner metal, commonly by sputtering. The trenches are subsequently filled with copper, commonly by electroplating. Copper and liner metal are removed from a top surface of the IMD layer by CMP and etch processes, leaving the copper and liner metal in the trenches.

An inter-level dielectric (ILD) layer 340 is formed over the metal interconnects in the first metal level 308. The ILD layer 340 may include, for example, silicon dioxide formed by a plasma enhanced chemical vapor deposition (PECVD) process using tetraethyl orthosilicate, also known as tetraethoxysilane or TEOS.

Vias 312 are formed through the ILD layer 340 to make electrical connections to the metal interconnects in the first metal level 308. The vias 312 may be formed, for example, by etching via holes through the ILD layer 340 to expose the metal interconnects in the first metal level 308 using an RIE process, forming a liner of titanium and/or titanium nitride, forming a tungsten layer on the liner using a CVD process so as to fill the via holes, and removing the tungsten and liner from a top surface of the ILD layer 340 using etchback and/or CMP processes.

A layer of interconnect metal 342 is formed over the ILD layer 340. The layer of interconnect metal 342 may include, for example, an adhesion metal layer of 10 to 50 nanometers of titanium tungsten or titanium, a sputtered aluminum layer 200 to 1000 nanometers thick on the adhesion metal layer, and possibly an optional antireflection metal layer of titanium nitride 20 to 50 nanometers thick on the sputtered aluminum layer.

An interconnect etch mask 344 is formed over the layer of interconnect metal 342 to cover areas for metal interconnects in a second metal level. The interconnect etch mask 344 may include photoresist formed by a photolithographic process.

Figure 3B:
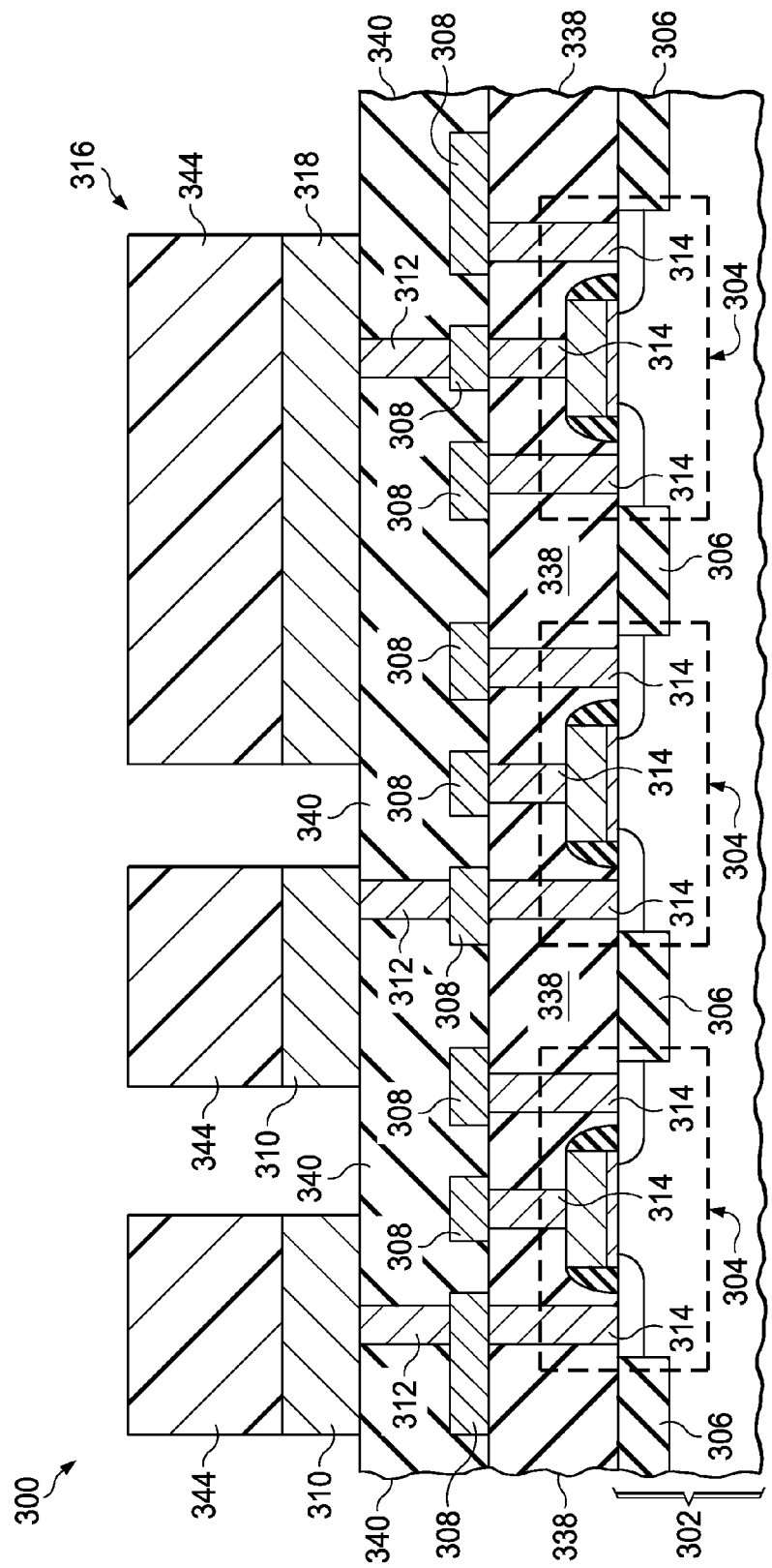

Referring to FIG. 3B, an interconnect metal etch process removes metal from the layer of interconnect metal 342 of FIG. 3A in areas exposed by the interconnect etch mask 344 to leave metal interconnects of a second metal level 310 and a bottom plate 318 of the isolation capacitor 316. The interconnect metal etch process may include an RIE process using chlorine, or may include a wet etch using an aqueous mixture of phosphoric acid, acetic acid and nitric acid, commonly referred to as aluminum leach etch. The interconnect etch mask 344 is removed after the interconnect metal etch process is completed.

Figure 3C:
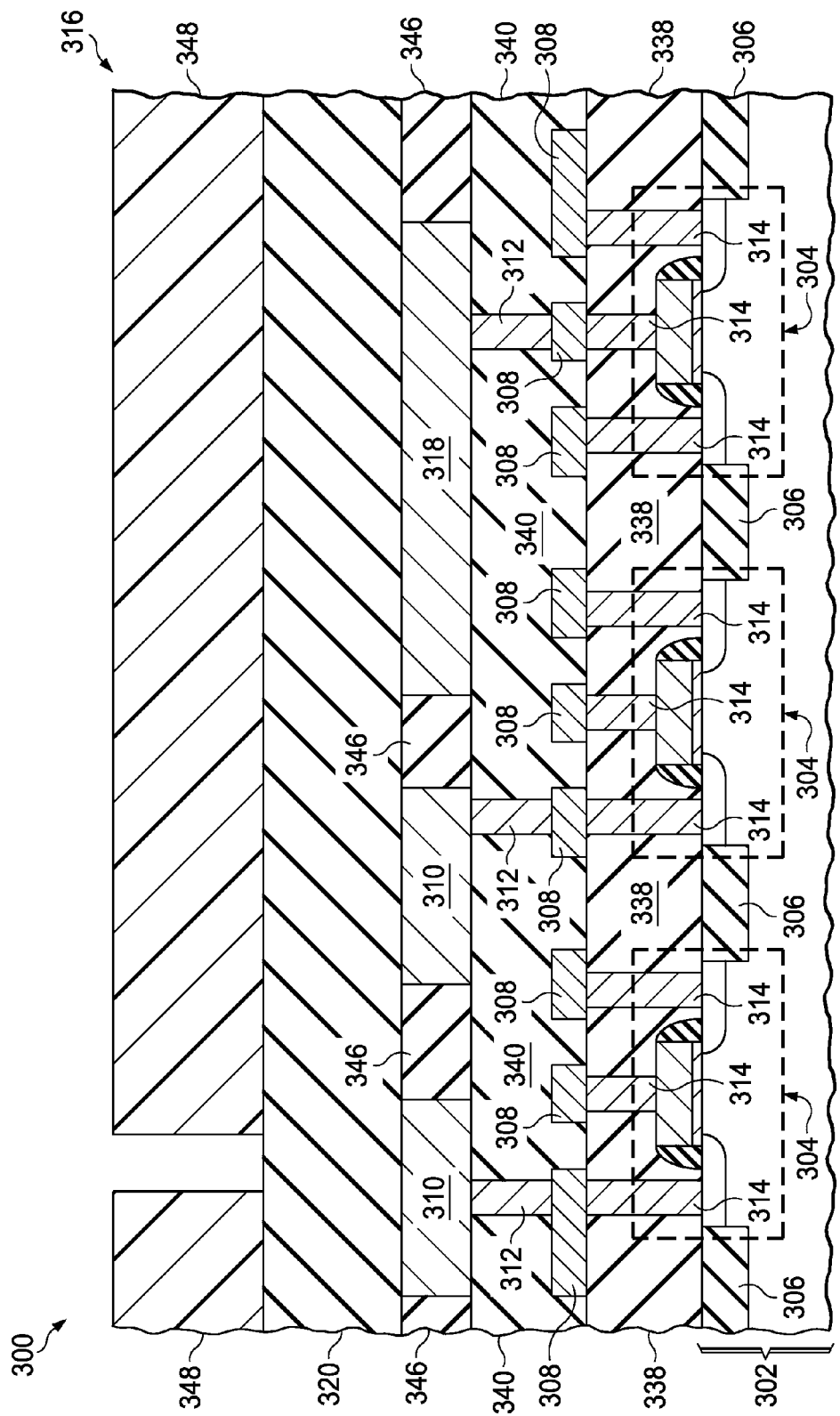

Referring to FIG. 3C, an IMD layer 346 is formed over the ILD layer 340 between the metal interconnects of the second metal level 310 and the bottom plate 318. The IMD layer 346 may include, for example, silicon dioxide formed by thermal decomposition of methylsilsesquioxane (MSQ).

A silicon dioxide dielectric layer 320 is formed over the second metal level 310 and the bottom plate 318 which extends across the integrated circuit 300. The silicon dioxide dielectric layer 320 may be formed, for example, by repeated formation of sublayers of silicon dioxide using a PECVD process with TEOS which produces a stress level less than 40 megapascals for a 600 nanometer thick sublayer. A thickness of the silicon dioxide dielectric layer 320 may be, for example 8 microns to 10 microns. Forming the silicon dioxide dielectric layer 320 to extend across the integrated circuit 300 may provide process margin for subsequently formed features and thus desirably reduce a fabrication cost of the integrated circuit 300.

A via etch mask 348 is formed over the silicon dioxide dielectric layer 320 to expose an area for a via to the metal interconnects of the second metal level 310. The via etch mask 348 may include photoresist formed by a photolithographic process, or may include a hard mask material such as silicon nitride or silicon carbide formed by a mask and etch process.

Figure 3D:
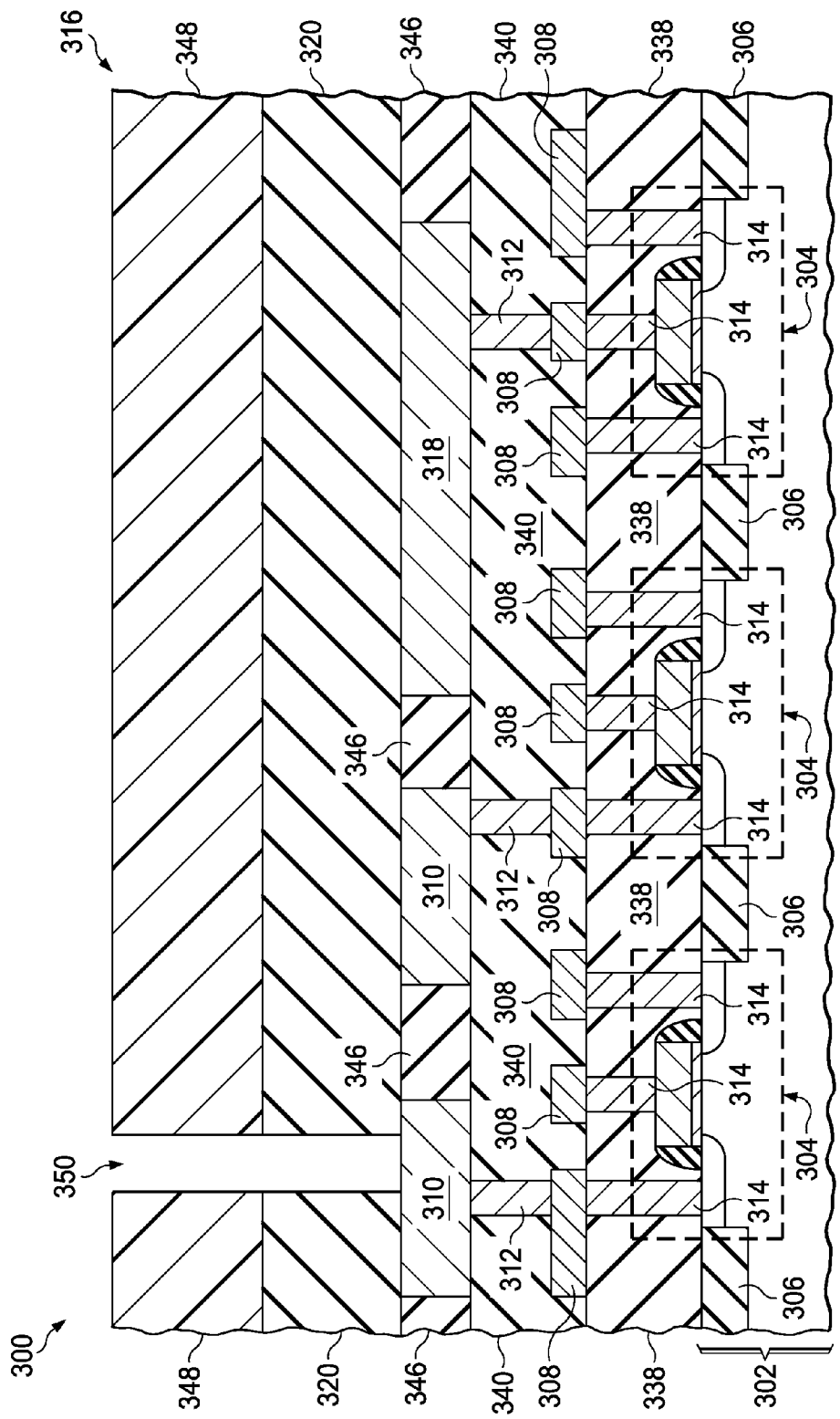

Referring to FIG. 3D, a via etch process removes silicon dioxide from the silicon dioxide dielectric layer 320 in the area exposed by the via etch mask 348 to form a lower via hole 350. The via etch process may include an RIE process using fluorine radicals. The via etch mask 348 is removed after the via etch process is completed, for example using an asher process.

Figure 3E:
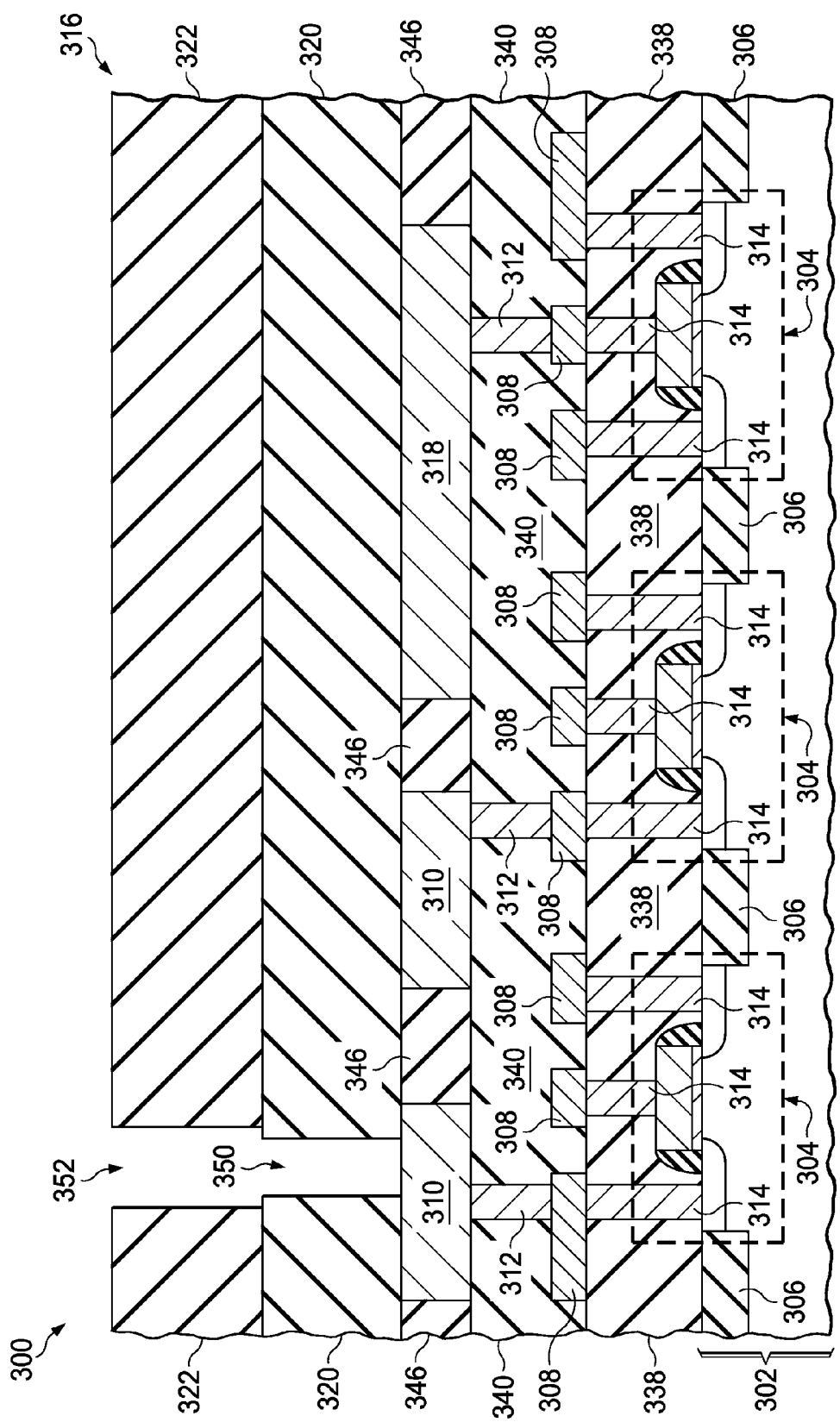

Referring to FIG. 3E, a polymer dielectric layer 322 is formed over the silicon dioxide dielectric layer 320 which extends across the integrated circuit 300. The polymer dielectric layer 322 may be formed of, for example, polyimide, PBO, BCB or parylene. A thickness of the polymer dielectric layer 322 may be, for example, 9 microns to 12 microns. Forming the polymer dielectric layer 322 to extend across the integrated circuit 300 may provide process margin for subsequently formed features of the integrated circuit 300 and thus desirably reduce the fabrication cost.

An upper via hole 352 is formed through the polymer dielectric layer 322 over the lower via hole 350. In versions of the instant example in which the polymer dielectric layer 322 is formed of a photosensitive material such as photosensitive polyimide, the upper via hole 352 may be formed directly using a photolithographic process of exposure and develop. In version of the instant example in which the polymer dielectric layer 322 is formed of a non-photosensitive material such as non-photosensitive polyimide, the upper via hole 352 may be formed by a mask and etch process. The polymer dielectric layer 322 is formed so as to remove residual moisture. For example, an instance of the polymer dielectric layer 322 including polyimide may be baked at 150° C. for 48 hours to remove residual moisture.

Figure 3F:
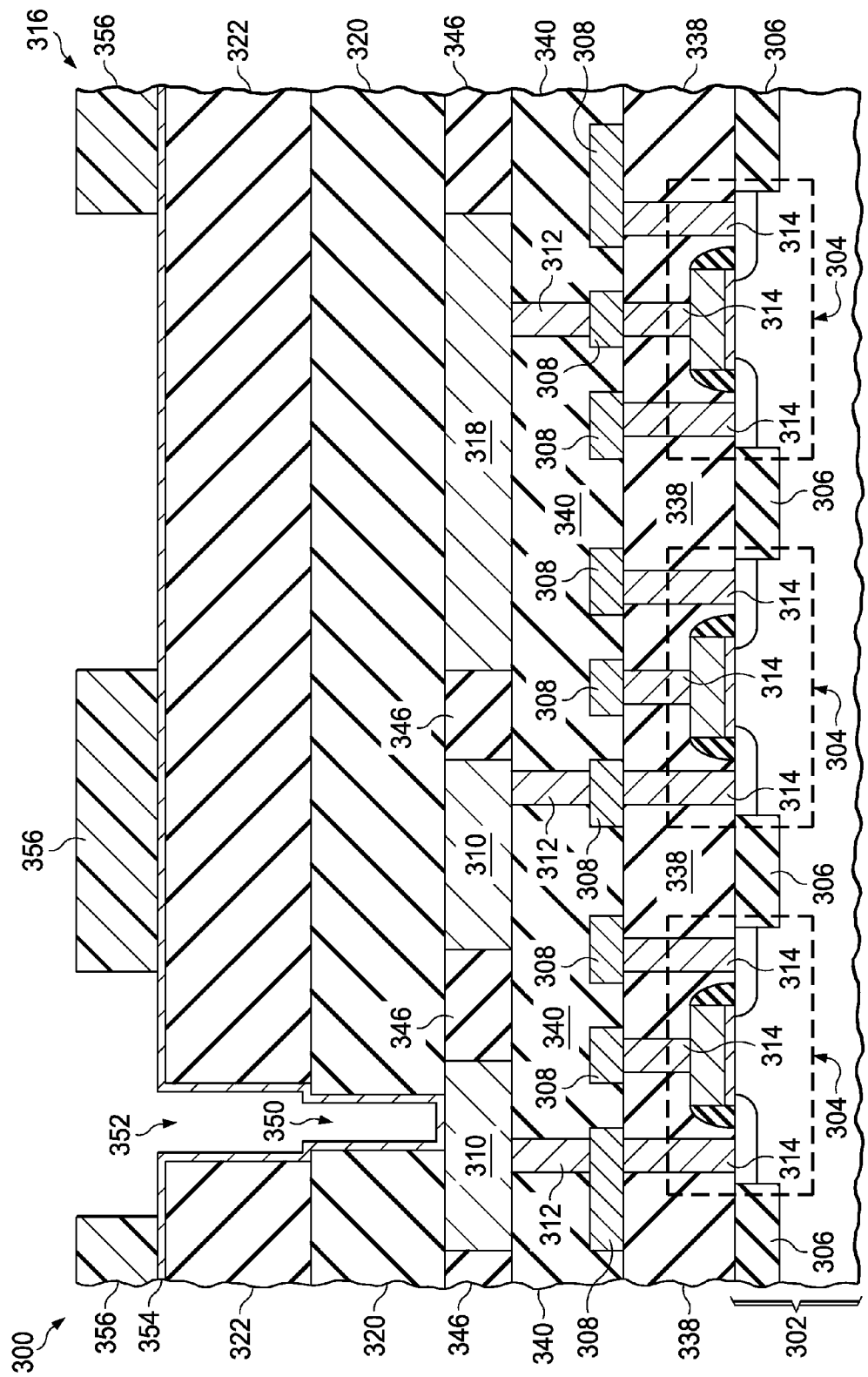

Referring to FIG. 3F, a metal seed layer 354 is formed over the polymer dielectric layer 322, extending into the upper via hole 352 and the lower via hole 350 and contacting a metal interconnect of the second metal level 310. The metal seed layer 354 may include, for example, an adhesion layer of 10 to 50 nanometers of titanium tungsten and a plating layer of 50 to 200 nanometers of sputtered copper.

A plating mask 356 is formed over the metal seed layer 354 to expose areas for a subsequently formed thick copper level. The plating mask 356 may include photoresist and may be 20 percent to 80 percent thicker than the subsequently formed thick copper level.

Figure 3G:
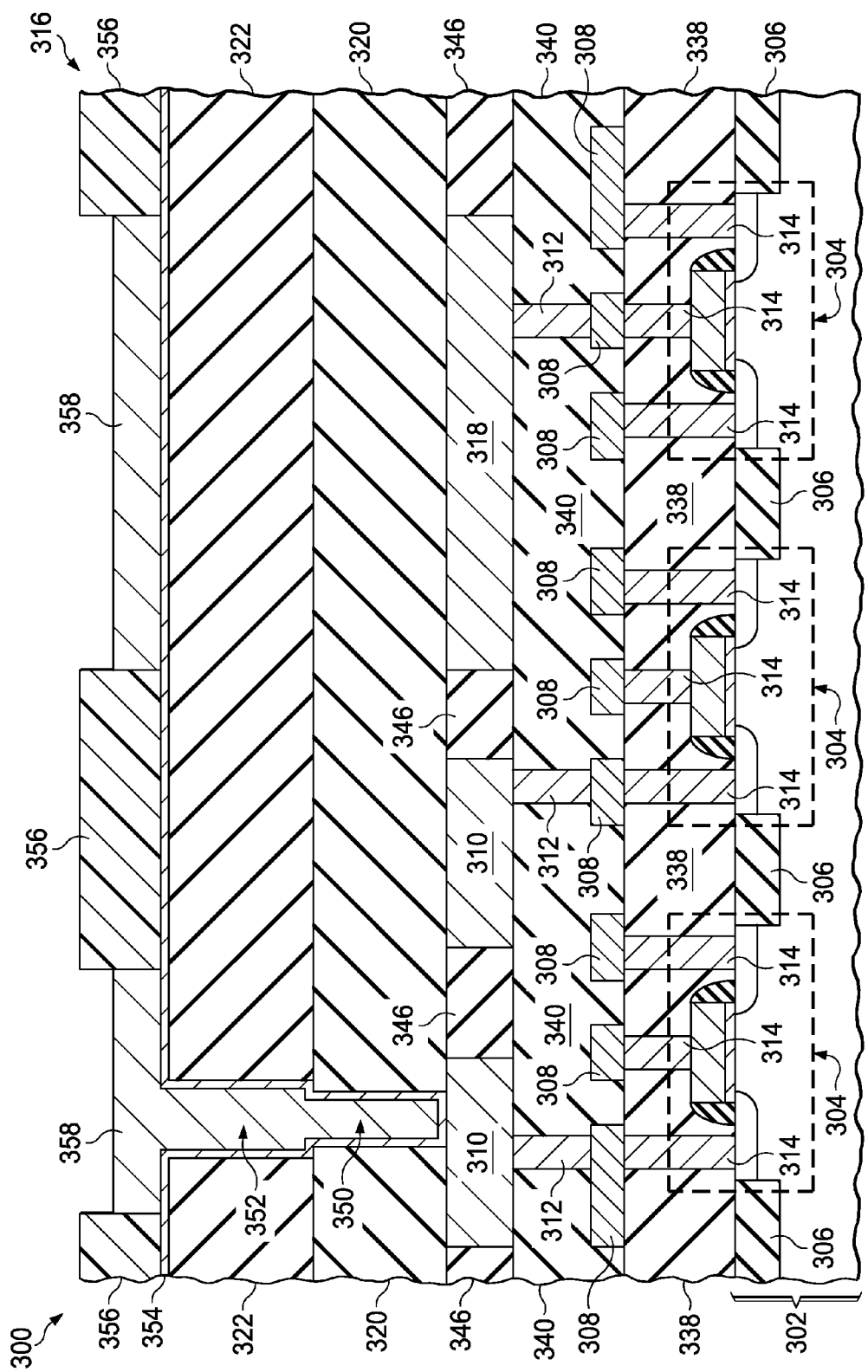

Referring to FIG. 3G, a copper electroplating process forms an electroplated copper layer 358 on the metal seed layer 354 in areas exposed by the plating mask 356. The electroplated copper layer 358 extends into the upper via hole 352 and the lower via hole 350. The electroplated copper layer 358 may be, for example, 5 microns to 10 microns thick.

Figure 3H:
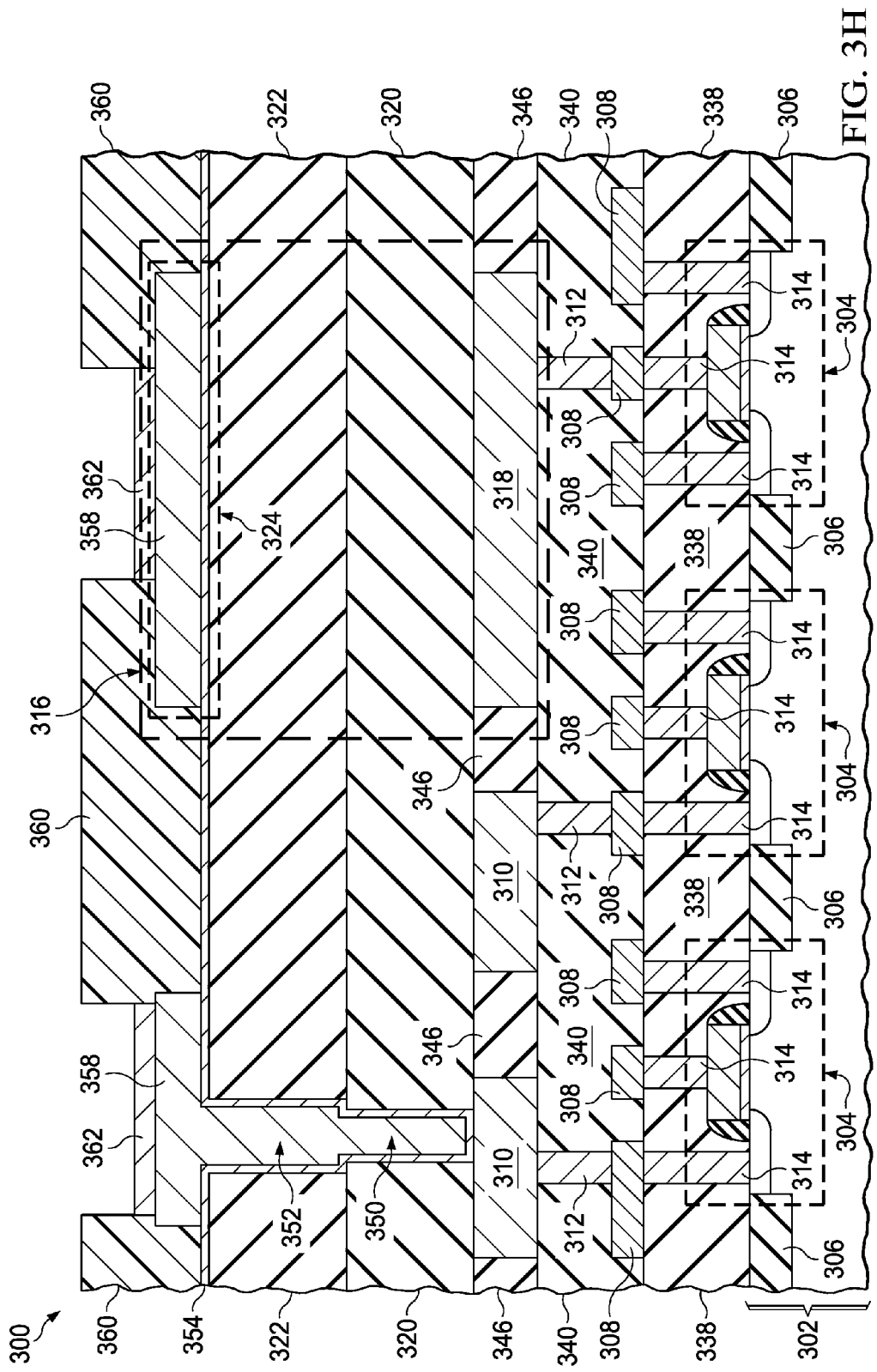

Referring to FIG. 3H, the plating mask 356 of FIG. 3G is removed, for example by dissolving polymer materials of the plating mask 356 in an appropriate solvent such as acetone or N-methylpyrrolidinone, commonly referred to as NMP. A bond pad plating mask 360 is formed over the electroplated copper layer 358 and the polymer dielectric layer 322, exposing areas on the electroplated copper layer 358 for under-bump metal for bond pads. An electroplating operation forms plated bond pads 362 on the electroplated copper layer 358 including the top plate 324 of the isolation capacitor 316, in the areas exposed by the bond pad plating mask 360. The bond pads 362 may include layers of nickel, palladium and gold. Forming the bond pad 362 on the top plate 324 simplifies a structure of the integrated circuit 300 and thus reduces the fabrication cost. The bond pad plating mask 360 is subsequently removed, for example by dissolution in acetone or NMP.

Figure 3I:
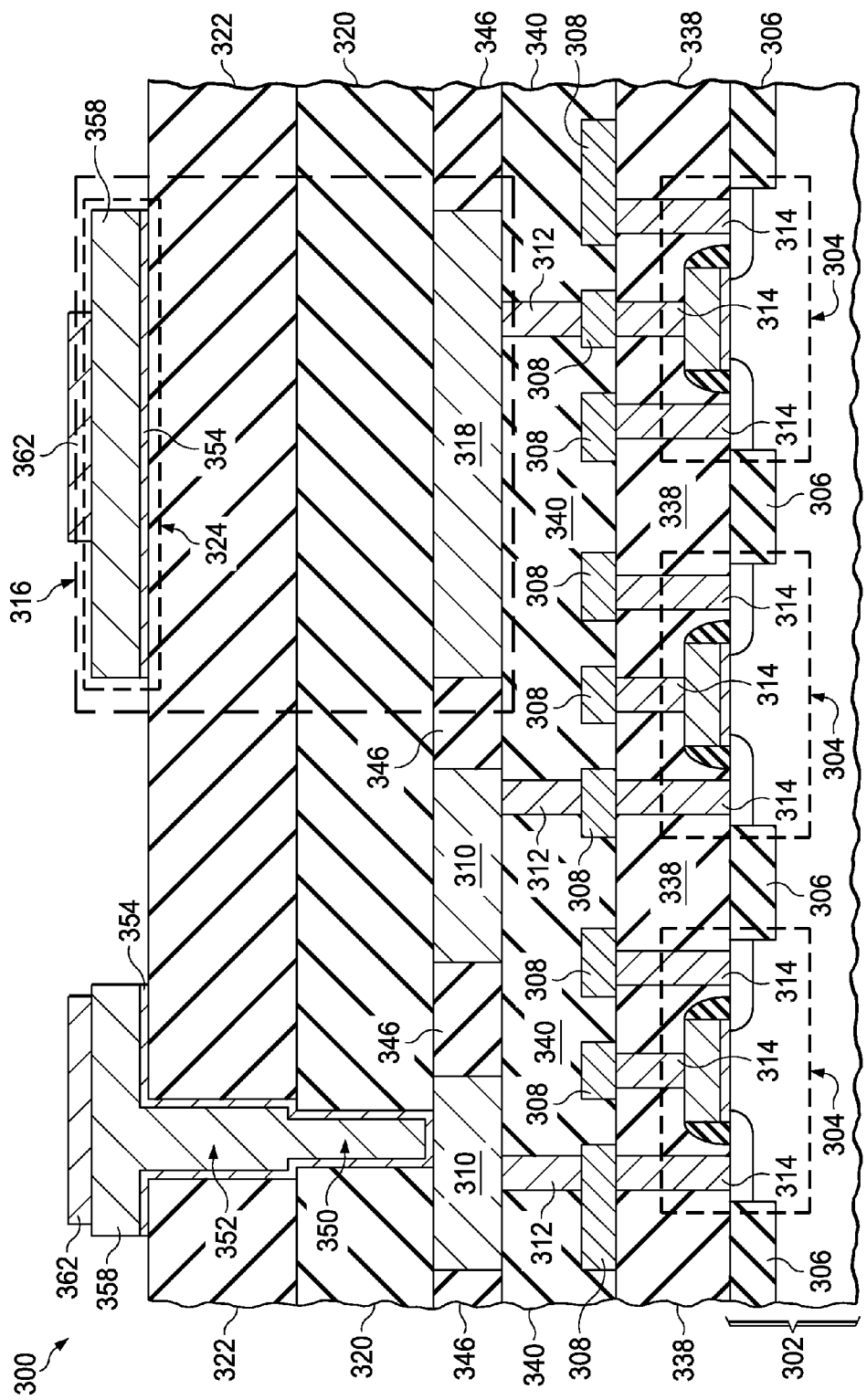

Referring to FIG. 3I, the metal seed layer 354 is removed in areas which are not covered by the electroplated copper layer 358, for example using an aqueous solution of nitric acid and hydrogen peroxide or an aqueous solution of ammonium hydroxide and hydrogen peroxide. The electroplated copper layer 358 combined with the metal seed layer 354 in the area for the isolation capacitor 316 provide a top plate 324 of the isolation capacitor 316.

Figure 3J:
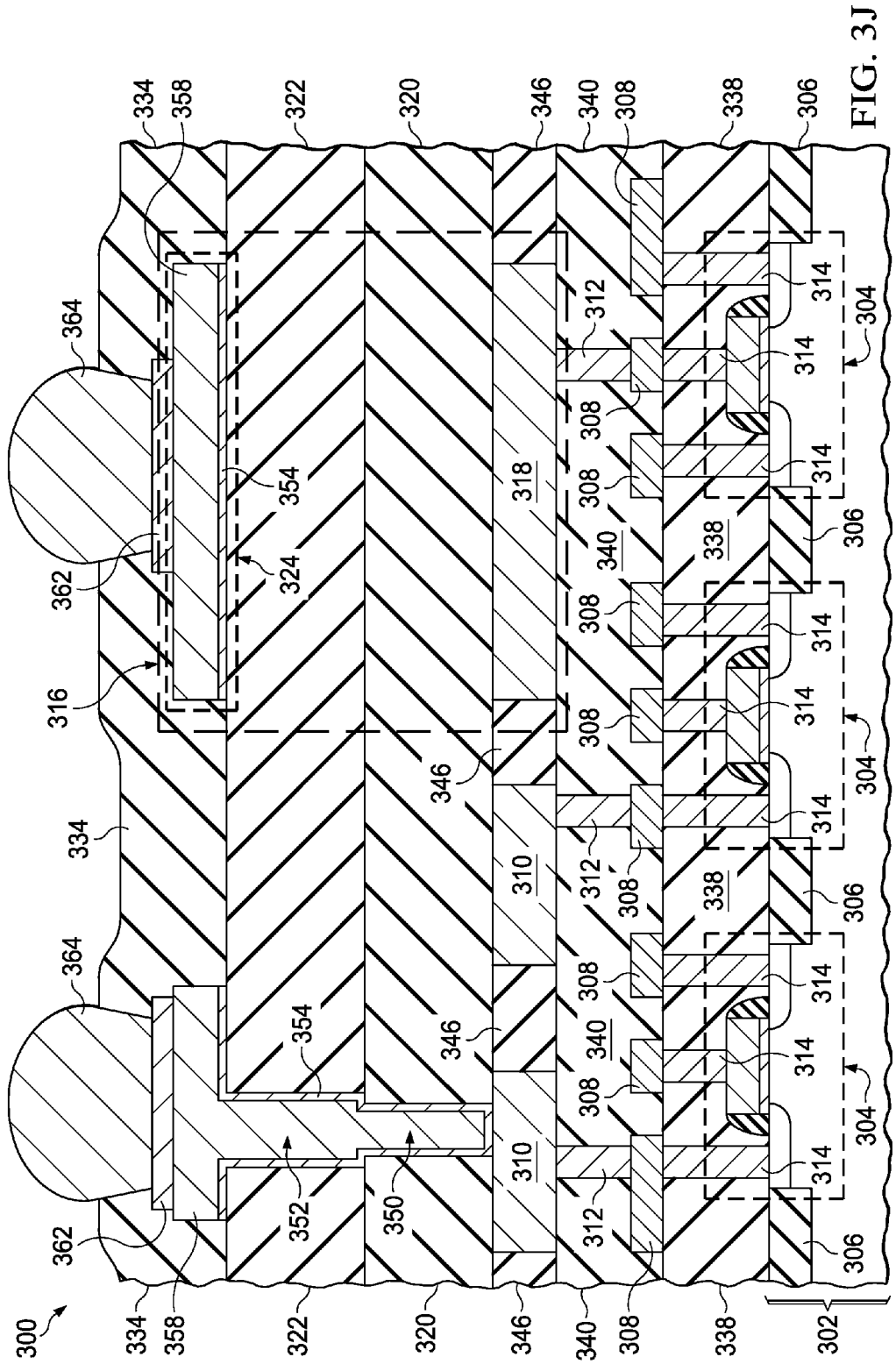

Referring to FIG. 3J, a layer of protective overcoat 334 is formed over an existing top surface of the integrated circuit 300 with openings over the bond pads 362. The layer of protective overcoat 334 may be, for example, polyimide or PBO, formed by a photolithographic process. In the instant example, the bond pads 362 are bump bond pads 362. Bump bonds 364 are formed on the bond pads 362. The electroplated copper layer 358 and the metal seed layer 354 in the upper via hole 352 and the lower via hole 350 provide an electrical coupling between the bump bond 364 and the metal interconnects of the second metal level 310. Alternatively, the bond pads 362 may be wire bond pads. The integrated circuit 300 may be encapsulated or sealed in a package to reduce moisture uptake in the polymer dielectric layer 322.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a substrate comprising a semiconductor;
a plurality of transistors disposed in said substrate;
at least one metal level containing metal interconnects, said metal level being disposed over said substrate;
an isolation capacitor, comprising:
a bottom plate;

a silicon dioxide dielectric layer disposed over said bottom plate;

a polymer dielectric layer disposed over said silicon dioxide dielectric layer and extending across said integrated circuit; and a top plate disposed over said polymer dielectric layer;

a bond pad disposed on said top plate; and another bond pad outside said isolation capacitor, said another bond pad being electrically coupled to an instance of said metal interconnects through a via disposed through said polymer dielectric layer.

2. The integrated circuit of claim 1, in which said bottom plate is a part of said metal level.

3. The integrated circuit of claim 1, in which said bottom plate includes a layer of adhesion metal containing titanium, and a layer of sputtered aluminum over said layer of adhesion metal.

4. The integrated circuit of claim 1, in which said top plate includes a metal seed layer and a layer of electroplated copper.

5. The integrated circuit of claim 1, in which said silicon dioxide dielectric layer extends across said integrated circuit.

6. The integrated circuit of claim 1, in which said silicon dioxide dielectric layer is localized to said isolation capacitor.

7. The integrated circuit of claim 1, in which a thickness of said silicon dioxide dielectric layer is 8 microns to 10 microns.

8. The integrated circuit of claim 1, in which said another bond pad is electrically coupled to said instance of said metal interconnects through a lower via disposed through said silicon dioxide dielectric layer.

9. The integrated circuit of claim 1, in which a thickness of said polymer dielectric layer is 9 microns to 12 microns.

10. The integrated circuit of claim 1, in which said polymer dielectric layer is comprised of polyimide.

11. The integrated circuit of claim 1, in which said polymer dielectric layer is comprised of poly(p-phenylene-2,6-benzobisoxazole) (PBO).

12. The integrated circuit of claim 1, in which said polymer dielectric layer is comprised of benzocyclobutene (BCB).

* * * * *